US012644174B2

(12) United States Patent
Wu et al.

(10) Patent No.: US 12,644,174 B2
(45) Date of Patent: Jun. 2, 2026

(54) DIFFUSION BONDED TUNGSTEN CONTAINING TARGET TO TITANIUM OR TITANIUM ALLOY BACKING PLATE

(71) Applicant: Honeywell International Inc., Charlotte, NC (US)

(72) Inventors: Xiaodan Wu, Spokane, WA (US); Susan D. Strothers, Mead, WA (US); Rashmi Mohanty, Liberty Lake, WA (US); Wayne Meyer, Cheney, WA (US)

(73) Assignee: Solstice Advanced Materials US, Inc., Morris Plains, NJ (US)

( * ) Notice: Subject to any disclaimer, the term of this patent is extended or adjusted under 35 U.S.C. 154(b) by 0 days.

(21) Appl. No.: 18/531,652

(22) Filed: Dec. 6, 2023

(65) Prior Publication Data

US 2025/0122608 A1 Apr. 17, 2025

Related U.S. Application Data

(60) Provisional application No. 63/544,142, filed on Oct. 13, 2023.

(51) Int. Cl.
*C23C 14/34* (2006.01)
(52) U.S. Cl.
CPC ................................ *C23C 14/3414* (2013.01)
(58) Field of Classification Search
CPC .................................................. C23C 14/3414
See application file for complete search history.

(56) References Cited

U.S. PATENT DOCUMENTS

| 4,586,063 | A | * | 4/1986 | Nakamura | ............ H01L 29/475 |
| | | | | | 438/572 |
| 5,693,203 | A | * | 12/1997 | Ohhashi | .............. H01J 37/3435 |
| | | | | | 428/673 |
| 5,913,100 | A | * | 6/1999 | Kohsaka | ................. C22C 27/04 |
| | | | | | 257/E21.582 |

(Continued)

FOREIGN PATENT DOCUMENTS

| CN | 113290293 A | 8/2021 |
| EP | 0025057 A1 | 3/1981 |

(Continued)

OTHER PUBLICATIONS

The Engineering Toolbox, "Metals—Temperature Expansion Coefficients", 2005, https://www.engineeringtoolbox.com/thermal-expansion-metals-d_859.html (Accessed Sep. 27, 2024) (Year: 2005).*

(Continued)

*Primary Examiner* — Patrick S Ott
(74) *Attorney, Agent, or Firm* — Faegre Drinker Biddle & Reath LLP

(57) ABSTRACT

A sputtering target assembly comprises a tungsten containing sputtering target, a titanium containing backing plate attached to the tungsten containing sputtering target and an interlayer positioned between and diffusion bonding the tungsten containing sputtering target and the titanium containing backing plate. The interlayer includes a nickel layer immediately adjacent to the tungsten containing sputtering target and a copper layer immediately adjacent to the nickel layer.

18 Claims, 4 Drawing Sheets

(56) References Cited

U.S. PATENT DOCUMENTS

| | | | | |
|---|---|---|---|---|
| 6,089,444 | A * | 7/2000 | Slattery | B32B 15/01 228/198 |
| 6,555,250 | B2 | 4/2003 | Shah et al. | |
| 8,206,646 | B2 | 6/2012 | Lo et al. | |
| 11,244,814 | B2 | 2/2022 | Takigawa | |
| 2008/0149477 | A1 * | 6/2008 | Lo | C23C 14/3414 266/274 |
| 2009/0078570 | A1 * | 3/2009 | Yi | C23C 14/3414 228/208 |
| 2014/0034490 | A1 | 2/2014 | Miao et al. | |
| 2015/0197848 | A1 | 7/2015 | Suzuki et al. | |
| 2017/0287685 | A1 * | 10/2017 | Ferrasse | C23C 24/106 |

FOREIGN PATENT DOCUMENTS

| | | | | |
|---|---|---|---|---|
| EP | 0590904 | B1 | 5/1999 | |
| TW | 234767 | B | 11/1994 | |
| TW | 201319291 | A | 5/2013 | |
| TW | 202108273 | A | 3/2021 | |
| WO | 80/01967 | A1 | 9/1980 | |
| WO | WO-2024242079 | A1 * | 11/2024 | C23C 14/34 |

OTHER PUBLICATIONS

WO-2024242079-A1 Translation (Year: 2024).*
Auwala et al., "Influence of electrodeposited Cu-Ni layer on interfacial reaction and mechanical properties of laser welded-brazed Mg/Ti lap joints", Journal of Manufacturing Processes, vol. 37, No. 1, 2019, pp. 251-265.

* cited by examiner

52 — Form a nickel layer on tungsten containing sputtering target

54 — Hot press tungsten containing sputtering target to copper layer

56 — Diffusion bond tungsten containing target to titanium containing backing plate

50

DIFFUSION BONDED TUNGSTEN CONTAINING TARGET TO TITANIUM OR TITANIUM ALLOY BACKING PLATE

CROSS-REFERENCE TO RELATED APPLICATION

This application claims priority to U.S. Provisional Patent Application No. 63/544,142, filed Oct. 13, 2023, which is herein incorporated by reference in its entirety.

TECHNICAL FIELD

The present disclosure relates to sputtering target assemblies and components for use with sputtering targets in physical vapor deposition systems.

BACKGROUND

Physical vapor deposition methodologies are used extensively for forming thin films of material over a variety of substrates. One area of importance for such deposition technology is semiconductor fabrication. A diagrammatic view of a portion of an exemplary physical vapor deposition ("PVD") apparatus 8 is shown in FIG. 1. In one configuration, a sputtering target assembly 10 comprises a backing plate 12 having a target 14 bonded thereto. A substrate 18 such as a semiconductive material wafer is within the PVD apparatus 8 and provided to be spaced from the target 14. A surface 16 of target 14 is a sputtering surface. As shown, the target 14 is disposed above the substrate 18 and is positioned such that sputtering surface 16 faces substrate 18. In operation, sputtered material 22 is displaced from the sputtering surface 16 of target 14 and used to form a coating (or thin film) 20 over substrate 18. In some embodiments, suitable substrates 18 include wafers used in semiconductor fabrication.

In an exemplary PVD process, the target 14 is bombarded with energy until atoms from the sputtering surface 16 are released into the surrounding atmosphere and subsequently deposit on substrate 18. In one exemplary use, plasma sputtering is used to deposit a thin metal film onto chips or wafers for use in electronics.

The target 14 is formed from the metal or metal alloy intended to be deposited as a film onto a surface. During the PVD process, metal atoms are removed from the surface of the sputtering target and are deposited onto the substrate 18.

The backing plate 12 may be used to support the target 14 during the PVD deposition process. A PVD deposition process may cause undesirable physical changes to a sputtering target assembly 10 including the target 14 and backing plate 12. For example, the PVD deposition process may include high temperatures which would cause the target 14 to warp or deform. To prevent this, the sputtering target assembly 10 and components may be designed to reduce these undesirable physical changes. For example, the backing plate 12 may be constructed to have a high heat capacity and/or heat conductivity, which can minimize or prevent undesirable physical changes to the target 14 and sputtering target assembly 10.

In an example two-component sputtering target assembly 10 design, as illustrated in FIG. 2, a backing plate 12 is formed as a separate component from the target 14. The backing plate 12 as shown is a single solid plate. The target 14 is joined to the backing plate 12 by techniques such as fastening, welding, soldering and diffusion bonding to form a sputtering target assembly 10. The backing plate 12 provides a variety of functions that include strengthening of mechanical properties and enhancement of physical properties of the whole sputtering target assembly 10. The sputtering target assembly 10 as shown in FIG. 2 includes the target 14 and the backing plate 12 after the two have been joined. The target assembly 10 is attached to a PVD system at mounting component 9 by techniques such as fastening with bolts or screws.

One method of joining a target 14 to a backing plate 12 is by diffusion bonding the two components together. In diffusion bonded targets, bonding of some target and backing plate materials is difficult because of the large difference in the coefficient of thermal expansion (CTE) between the target material and backing plate material. For example, in diffusion bonded targets, bonding some target materials, for example tungsten, to conventional backing plate materials such as copper or copper alloy backing plates is difficult because of the large difference in the CTE between these materials. One approach to mitigate this is to use a backing plate with a smaller CTE difference such as titanium.

If an object is made by joining together two bodies of metals having a difference in the CTE, de-bonding or even cracking may occur when the object is heated, for example during bonding or when use in a high temperature environment such as PVD. As an example, when creating a sputtering target assembly 10 as in FIG. 2, thermal stresses can build up at the interface 24 after bonding the target 14 to the backing plate 12 during the cooling phase when the materials are physically connected by a solid state bond but contract at a different rate.

Generally thermal stress in a system having multiple materials is proportional to the difference in CTE between the materials in the system. The relationship between thermal stress ($\sigma$), as a function of temperature change ($\Delta T$), and the value of the difference in CTE ($\Delta CTE$, also called CTE mismatch) can be shown using equation 1:

$$\sigma \sim \Delta CTE * \Delta T \qquad \text{Equation 1}$$

What is needed is a method for bonding a tungsten containing target to a backing plate which is an improvement over the foregoing.

SUMMARY

Embodiment 1 is a sputtering target assembly having a tungsten containing sputtering target a titanium containing backing plate attached to the tungsten containing sputtering target; and an interlayer positioned between and diffusion bonding the tungsten containing sputtering target and titanium containing backing plate. The tungsten containing sputtering target comprises 0 wt. % to about 50 wt. % of an alloying component and the balance is tungsten, wherein the alloying component is selected from the group consisting of titanium, aluminum and molybdenum. The interlayer includes a nickel layer immediately adjacent to the tungsten containing sputtering target and a copper layer immediately adjacent to the nickel layer.

Embodiment 2 is the sputtering target assembly of Embodiment 1 wherein the alloying component is titanium and the tungsten containing sputtering target comprises titanium in an amount from about 1 wt. % to about 30 wt. % and the balance is tungsten.

Embodiment 3 is the sputtering target assembly of Embodiment 1 wherein the alloying component is titanium and the tungsten containing sputtering target comprises titanium in an amount from about 3 wt. % to about 15 wt. % and the balance is tungsten.

Embodiment 4 is the sputtering target assembly of Embodiment 1 wherein the tungsten containing sputtering target comprises 100 wt. % tungsten.

Embodiment 5 is the sputtering target assembly of Embodiment 1 wherein the alloying component is aluminum and the tungsten containing sputtering target comprises aluminum in an amount from about 0.1 wt. % to about 5 wt. % and the balance is tungsten.

Embodiment 6 is the sputtering target assembly of Embodiment 1 wherein the alloying component is molybdenum and the tungsten containing sputtering target comprises molybdenum in an amount from about 1 wt. % to about 50 wt. % and the balance is tungsten.

Embodiment 7 is the sputtering target assembly of any one of Embodiments 1-6 wherein the tungsten containing sputtering target as a purity of at least 3N.

Embodiment 8 is the sputtering target assembly of any one of Embodiments 1-7 wherein the titanium containing backing plate has a coefficient of thermal expansion (CTE) from about $8.6 \times 10^{-6}$ m/m° C. to about $10 \times 10^{-6}$ m/m° C.

Embodiment 9 is the sputtering target assembly of any one of Embodiments 1-8 wherein the tungsten containing sputtering target has a coefficient of thermal expansion (CTE) from about $4.5 \times 10^{-6}$ m/m° C. to about $8 \times 10^{-6}$ m/m° C.

Embodiment 10 is the sputtering target assembly of any one of Embodiments 1-9 wherein a bond formed by the interlayer is at least about 98% as determined with C-Scan.

Embodiment 11 is the sputtering target assembly of any one of Embodiments 1-10 wherein a bond between the tungsten containing sputtering target and the titanium containing backing plate has an average bond strength of at least about 10 ksi (68.9 MPa).

Embodiment 12 is the sputtering target assembly of any one of Embodiments 1-11 wherein the interlayer consists of the nickel layer and the copper layer.

Embodiment 13 is the sputtering target assembly of any one of Embodiments 1-12 wherein the sputtering target assembly has a bond strength of at least 10 ksi (68.9 MPa) and not more than 30 ksi (207 MPa).

Embodiment 14 is a method for forming a sputtering target assembly by forming a nickel layer on a back surface of a tungsten containing target, forming a copper layer on the nickel layer and hot pressing to bond and diffusion bonding the tungsten containing sputtering target to a titanium containing backing plate. The tungsten containing target includes 0 wt. % to about 50 wt. % of an alloying component and the balance tungsten. The alloying component is selected from the group consisting of titanium, aluminum, and molybdenum. The copper layer immediately adjacent to the nickel layer.

Embodiment 15 is the method of Embodiment 14 wherein the alloying component is tungsten and the tungsten containing sputtering target comprises titanium in an amount from about 1 wt. % to about 30 wt. % and the balance is tungsten.

Embodiment 16 is the method of Embodiment 14 wherein the tungsten containing sputtering target comprises 100 wt. % tungsten.

Embodiment 17 is the method of Embodiment 14 wherein the alloying component is molybdenum and the tungsten containing sputtering target comprises molybdenum in an amount from about 1 wt. % to about 50 wt. % and the balance is tungsten.

Embodiment 18 is the method of any one of Embodiments 14-17 wherein the sputtering target assembly has a percent bond of at least 98% and less than 100%.

Embodiment 19 is the method of any one of Embodiments 14-18 wherein diffusion bonding the tungsten containing sputtering target to a titanium containing backing plate comprises hot isostatic pressing (HIP) at about 300° C. to about 600° C. and a pressure of about 15 ksi (103 MPa) to about 30 ksi (207 MPa).

Embodiment 20 is the method of any of Embodiments 14-19 wherein forming the nickel layer includes forming the nickel layer of less than about 10 microns by electroplating.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

DETAILED DESCRIPTION

Disclosed herein is an improved sputtering target assembly containing a tungsten containing sputtering target and a titanium containing backing plate and a method of making the same. The titanium containing backing plate may be either a titanium backing plate (i.e., formed from titanium and inevitable impurities) or a titanium alloy backing plate formed from a titanium alloy. Compared to the traditional Cu alloy backing plate, the CTE of titanium backing plate is closer to that of tungsten. When a titanium backing plate is used, it produces less thermal stress during cooling after the bonding process, resulting in fewer issues with either debonding or cracking of the tungsten-containing sputtering targets.

However, it is difficult to join a tungsten-containing sputtering target to a titanium-containing backing plate because a high bonding temperature is needed to facilitate the diffusion of titanium and tungsten. Further, during cooling down for the high-temperature bonding process, a significant thermal stress is produced between the sputtering target and backing plate, resulting in debonding and/or cracking of the sputtering target. The interlayer described herein reduces debonding and/or cracking.

Figure 1:
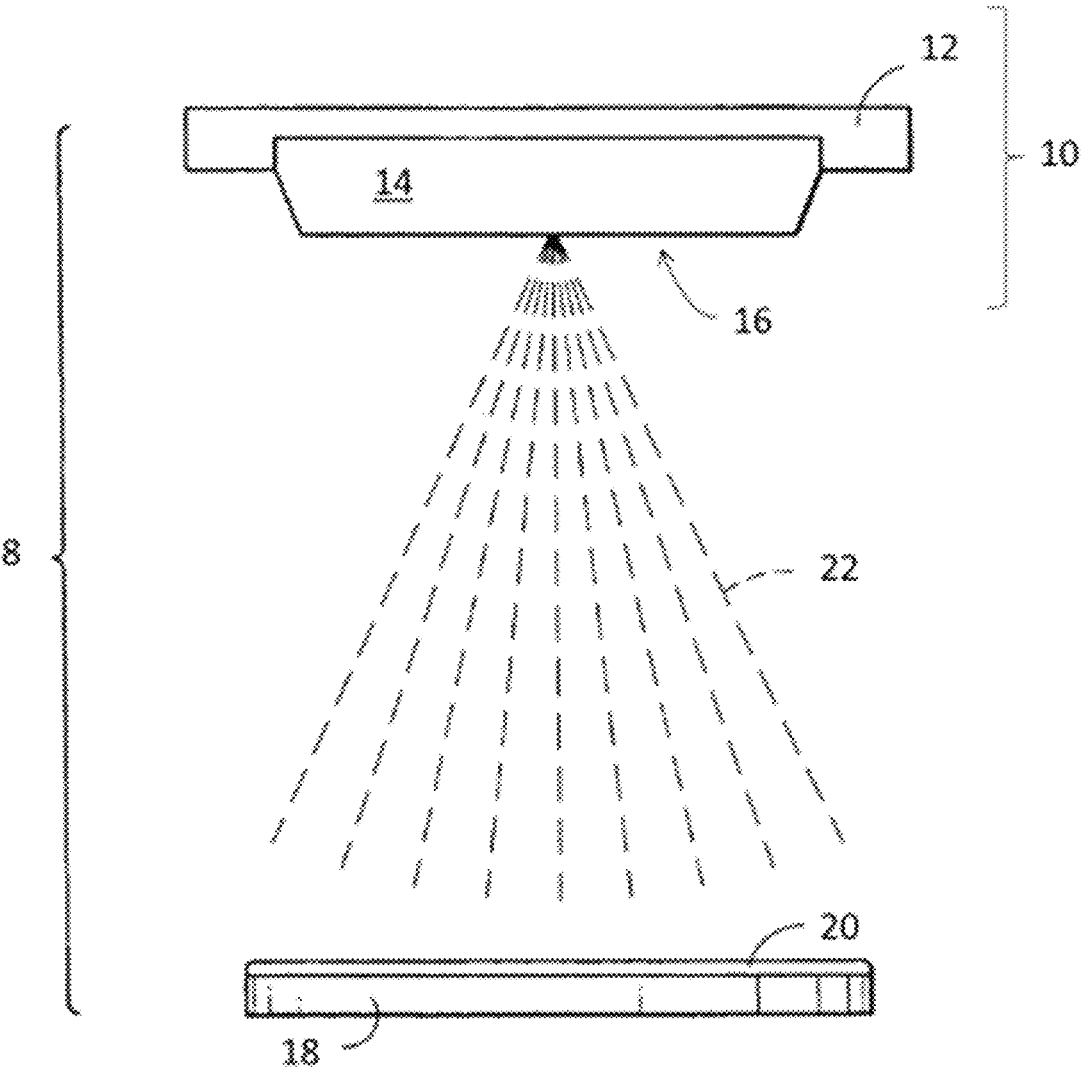
FIG. 1 is a schematic illustration of a sputtering apparatus.
Figure 2:
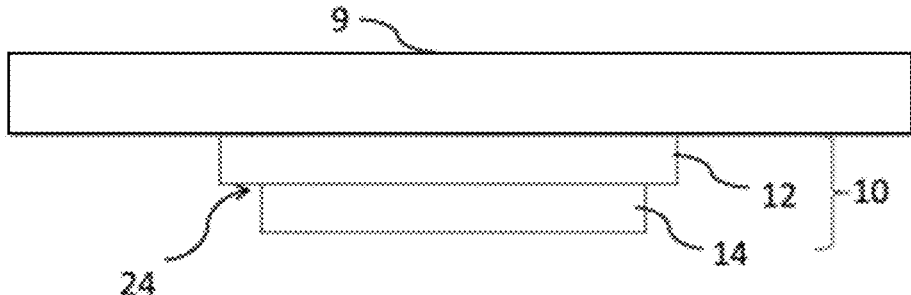
FIG. 2 is a schematic illustration of a sputtering target assembly.
Figure 3:
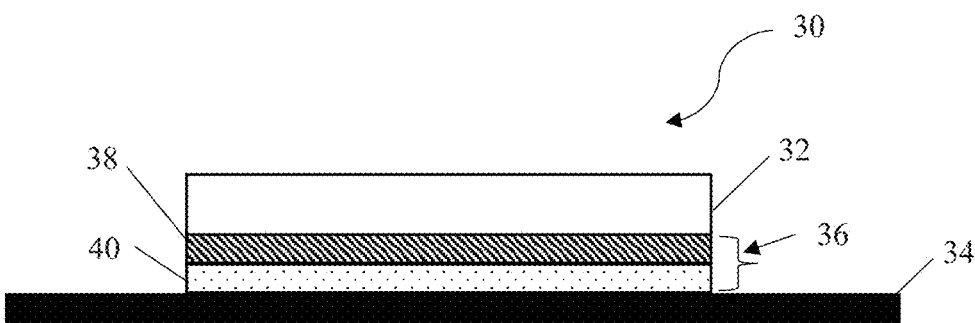
FIG. 3 is a schematic illustration of a sputtering target assembly according to some embodiments of the invention.

FIG. 3 is a schematic cross-sectional view of sputtering target assembly 30 which includes tungsten-containing sputtering target 32, titanium containing backing plate 34 and interlayer 36. The interlayer 36 is positioned between tungsten-containing sputtering target 32 and titanium-containing backing plate 34 and join the components to one another.

Tungsten containing sputtering target 32 includes tungsten as a major component, optionally one or more alloying components selected from the group consisting of titanium, molybdenum and aluminum, and inevitable impurities. In some embodiments, tungsten containing sputtering target 32 consists of or consists essentially of tungsten and 0 wt. % to 50 wt. % of one or more alloying components. In some embodiments, tungsten containing sputtering target 32 is formed from 100% high purity tungsten. That is, tungsten containing sputtering target 32 consists of tungsten with inevitable impurities and is not a tungsten alloy. In other embodiments, tungsten containing sputtering target 32 is formed from a tungsten alloy, such as a tungsten-titanium alloy, a tungsten-molybdenum alloy or a tungsten-aluminum alloy. In some embodiments, tungsten containing sputtering target 32 has a coefficient of thermal expansion (CTE) from about $4.5 \times 10^{-6}$ m/m° C. to about $8 \times 10^{-6}$ m/m° C. or a CTE from about $4.5 \times 10^{-6}$ m/m° C. to about $5.5 \times 10^{-6}$ m/m° C.

In some embodiments, the alloying component is titanium. In some embodiments, titanium is present in the tungsten containing sputtering target 32 in an amount from about 1 wt. % to about 30 wt. % based on the total weight of the sputtering target 32. In other embodiments, titanium is present in the tungsten containing sputtering target 32 in an amount from about 1 wt. % to about 20 wt. % or from about 3 wt. % to about 15 wt. % based on the total weight of the sputtering target.

Tungsten is a major component in the tungsten containing sputtering target 32. That is, tungsten is present in the tungsten containing sputtering target 32 at an amount greater than any other component. In some embodiments, tungsten containing sputtering target 32 consists essentially of or consists of tungsten and the balance is titanium. In one embodiment, the sputtering target 32 contains about 10% by weight titanium and the balance is tungsten.

In some embodiments, tungsten is the major component in the tungsten containing sputtering target 32 and molybdenum comprises the balance. For example, molybdenum can be present in an amount from about 1 wt. % to about 50 wt. %, or from about 20 wt. % to about 40 wt. %, or from about 25 wt. % to about 35 wt. % based on the weight of the sputtering target. In some embodiments, tungsten containing sputtering target 32 consists essentially of or consists of molybdenum and the balance is tungsten.

In some embodiments, tungsten is the major component in the tungsten containing sputtering target 32 and aluminum comprises the balance. For example, aluminum can be present in an amount from about 0.1 wt. % to about 5 wt. % aluminum, or from about 0.1 wt. % to about 1 wt. % based on the weight of the sputtering target 32.

One skilled in the art will recognize that tungsten containing sputtering target 32 will also include inevitable impurities. In some embodiments, tungsten containing sputtering target 32 is a high purity target having a purity of at least 3N (99.9%), or at least 4N (99.99%), or at least 5N (99.999%). In some embodiments, tungsten containing sputtering target 32 has a purity of 5N.

Titanium containing backing plate 34 is connected to tungsten containing sputtering target 32. In some embodiments, titanium containing backing plate 34 consists of or consists essentially of titanium and 0 wt. % to 50 wt. % of one or more alloying components. In some embodiments, titanium containing backing plate 34 is formed from 100% high purity titanium. That is, titanium containing backing plate 34 consists of titanium with inevitable impurities and is not a titanium alloy. In other embodiments, titanium containing backing plate 34 is formed from a titanium alloy such as, 3N Ti, CP Grade 2 Ti, Grade 5 Ti or Grade 12 Ti. In some embodiments, titanium containing backing plate 34 has a CTE from about $8.6 \times 10^{-6}$ m/m° C. to about $10 \times 10^{-6}$ m/m° C. In comparison, tungsten has a CTE of $4.5 \times 10^{-6}$ m/m° C. Based on the rule of mixtures, a tungsten-titanium alloy containing 1 wt. % to 30 wt. % titanium has a CTE of 4.6 to $8 \times 10^{-6}$ m/m° C., a tungsten-aluminum alloy containing 0.1 wt. % to 5 wt. % aluminum has a CTE of 4.5 to $5.5 \times 10^{-6}$ m/m° C., and a tungsten-molybdenum containing 1 wt. % to 50 wt. % molybdenum has a CTE of 4.5 to $5 \times 10^{-6}$ m/m° C.

Interlayer 36 attaches tungsten containing sputtering target 32 to titanium containing backing plate 34. Interlayer 36 includes nickel layer 38 and copper layer 40. Nickel layer 38 is directly adjacent to tungsten containing sputtering target 32. Nickel layer 38 is attached to the back surface of tungsten containing sputtering target 32 and opposite the sputtering surface. Nickel layer 38 can consist or consist essentially of nickel and impurities. Nickel layer 38 is a thin layer. For example, nickel layer 38 can have a thickness from about 1 to about 10 microns. In some embodiments, interlayer 36 consists of nickel layer 38 and copper layer 40.

Copper layer 40 is directly adjacent to nickel layer 38. Copper layer 40 is diffusion bonded to nickel layer 38. Copper layer 40 can be formed of an oxygen-free copper, such as Cu—OFE (oxygen fee electronic grade). In some embodiments, copper layer 40 is formed of copper that is oxygen-free up to 99.99%. Copper layer 40 is a thin layer. For example, copper layer 40 can have a thickness from about 0.010 to about 0.300 inches (about 0.254 mm to about 7.62 mm).

Figure 4:
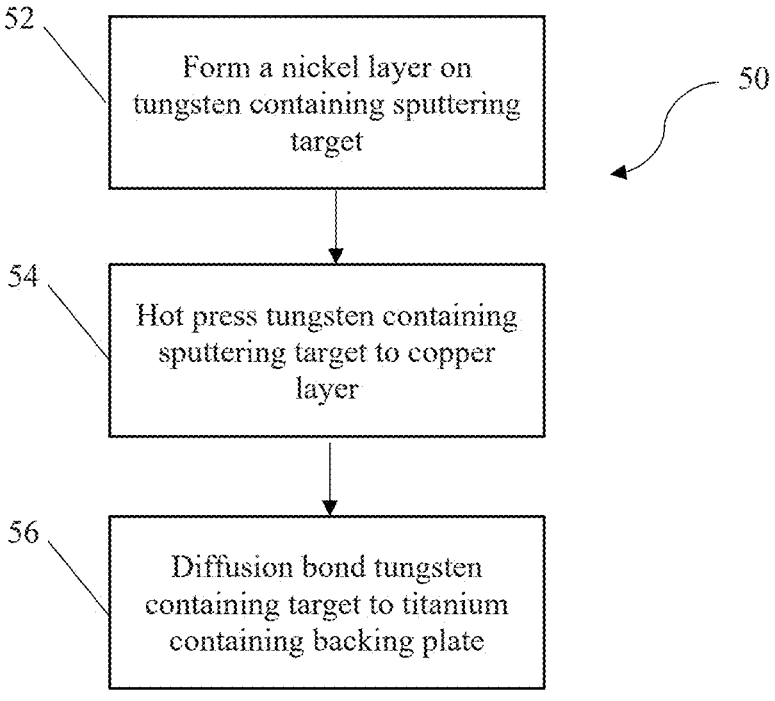
FIG. 4 is a process diagram of one method for making a sputtering target assembly.

FIG. 4 illustrates method 50 for making sputtering target assembly 30. Method 50 includes plating a nickel layer on a tungsten containing sputtering target (step 52), hot pressing the tungsten containing sputtering target to a copper layer (step 54) and diffusion bonding the tungsten containing sputtering target to a titanium containing backing plate (step 56).

In step 52, a thin layer of nickel is formed onto the surface of a tungsten containing sputtering target. This forms nickel layer 38 on tungsten containing sputtering target 32 shown in FIG. 3. In some embodiments, the nickel layer can be formed by electroplating, PVD process or ion plating. In some embodiments, the nickel layer can be about 1 to about 10 microns thick.

In step 54, the tungsten containing sputtering target with the nickel layer is joined to a copper layer by hot pressing. This forms copper layer 40 on nickel layer 38 of FIG. 3. In some embodiments, the copper layer is an oxygen-free copper foil. The copper layer can be joined to the tungsten containing sputtering target and adhesion layer by hot pressing the components at about 700° C. to about 1000° C. or at about 800° C. to about 1000° C.

In Step 56, the tungsten containing sputtering target with the nickel layer and the copper layer is joined to a titanium containing backing plate by diffusion bonding. In Step 56, the tungsten containing sputtering target and a titanium containing backing plate are bonded by hot isostatic pressing (HIP) to form sputtering target assembly 30 of FIG. 3.

In some embodiments, the HIP process is conducted at about 300° C. to about 600° C. After the bonding process, the assembly is allowed to cool to room temperature. The low temperature of the HIP process minimizes the thermal stress between the tungsten containing sputtering target and the titanium containing backing plate during the cooling down period after the HIP.

In some embodiments, the HIP process can be conducted at a pressure of about 15 kilopounds per square inch (ksi) or greater (about 103 megapascals (MPa) or greater). For example, the HIP process can be conducted at a pressure of about 15 ksi to about 30 ksi (about 103 MPa to about 207 MPa). In some embodiments the pressure can be from about 20 ksi to about 30 ksi (about 138 MPa to about 207 MPa).

One skilled in the art will recognize that additional steps can be performed before, after or between the steps presented in FIG. 4. For example, the tungsten containing sputtering target may be machined after step 54 and before step 56. The sputtering target assembly can also be machined and/or cleaned after step 56.

C-Scan imaging can be used to assess the bond between the tungsten containing sputtering target 32 and the titanium containing backing plate 34. In some embodiments, the percent bond is at least about 98%. In some embodiments, the percent bond is at least about 99%. In some embodiments, the percent bond is at least about 98% or at least about 99% and less than about 100%.

The bond between tungsten containing sputtering target 32 and titanium containing backing plate 34 is of sufficient strength to withstand a PVD process. In some embodiments, the average bond strength is at least about 10 ksi (68.9 MPa) or at least about 14 ksi (96.5 MPa). In other embodiments, the average bond strength is at least about 16 ksi. In still further embodiments, the bond strength is at least 10 ksi (68.9 MPa) and not more than 30 ksi (207 MPa). In still further embodiments, the bond strength is at least 14 ksi (96.5 MPa) and not more than 30 ksi (207 MPa). The average bond strength can be determined using a ram tensile test method as described in Zatorski, Z. (2007) Evaluation of Steel Clad Plate Weldability Using Ram Tensile Test Method. Engineering Transactions, 55(3), 229-238.

It is difficult to join a tungsten-containing sputtering target to a titanium-containing backing plate because a high bonding temperature is needed to facilitate the diffusion of titanium and tungsten. During cooling down for the high-temperature bonding process, a significant thermal stress is produced between the sputtering target and backing plate, resulting in debonding and/or cracking of the sputtering target. The interlayer described herein reduces debonding and/or cracking.

Method 50 provides a sputtering target assembly 30 in which the tungsten containing sputtering target 32 does not de-bond from the titanium containing backing plate 34. Additionally, the tungsten containing sputtering target 32 does not experience cracking.

As used herein the term "about" means±10%, ±5% or ±1%.

EXAMPLES

The following non-limiting Examples illustrate various features and characteristics of the present invention, which is not to be construed as limited thereto and wherein all percentages are weight percentages unless otherwise indicated.

Example 1: W Diffusion Bonded to Ti Backing Plate with Copper and Nickel Interlayer A pure tungsten sputtering target (100 wt. % tungsten with inevitable impurities) was diffusion bonded to a pure titanium backing plate (100 wt. % titanium with inevitable impurities.)

First, nickel was electroplated on the back surface of the tungsten sputtering target to form a nickel layer. The nickel layer was about 10 microns (µm) thick.

Next, a copper layer was formed on the nickel layer by hot pressing a OFE copper foil to the nickel using a hot press at about 800° C. to about 1000° C. The OFE copper foil was about 0.02 inches (0.51 mm) thick.

A sputtering target assembly was created by stacking the titanium backing plate and the tungsten sputtering target having the nickel and copper layers. This sputtering target assembly was bonded with HIP at 520° C. and 25 kilopounds per square inch (ksi) (172 megapascals (MPa)).

The resulting sputtering target assembly did not experience de-bonding or cracking of the sputtering target. The percent bond as determined by C-Scan was 99.8%. The bond strength was measured according to Zatorski, Z. (2007) Evaluation of Steel Clad Plate Weldability Using Ram Tensile Test Method. Engineering Transactions, 55(3), 229-238.

Three samples were prepared using the method of Example 1. The samples had a bond strength of 20.6 ksi (140 MPa), 27.9 ksi (192 MPa) and 14.2 ksi (97.9 MPa), respectively, resulting in an average bond strength (e.g., the bond between the sputtering target and the backing plate) of 16.3 ksi (112 MPa).

Comparative Example 1: W Diffusion Bounded to Ti Backing Plate

A pure tungsten sputtering target (100 wt. % tungsten with inevitable impurities) was diffusion bonded to a pure titanium backing plate (100 wt. % titanium with inevitable impurities) without the use of an interlayer.

The back surface of the tungsten sputtering target was scrolled. The scrolled surface of the sputtering target was positions adjacent to the titanium backing plate and the assembly was bonded with HIP at 520° C. and 25 kilopounds per square inch (ksi) (172 MPa).

Three samples were prepared using the method of Comparative Example 1. In two of the samples, the backing plate separated from the sputtering target during machining, which is not commercially acceptable. The bond strength of the one sample that did not separate was measured according to Zatorski, Z. (2007) Evaluation of Steel Clad Plate Weldability Using Ram Tensile Test Method. Engineering Transactions, 55(3), 229-238. The assembly had a bond strength of 2.4 ksi (16.5 MPa). The percent bond as determined by C-Scan was 97.1%. The resulting sputtering target assembly did not experience de-bonding or cracking of the sputtering target. The percent bond as determined by C-Scan was 99.98%. The average bond strength was measured according to Zatorski, Z. (2007) Evaluation of Steel Clad Plate Weldability Using Ram Tensile Test Method. Engineering Transactions, 55(3), 229-238. The average bond strength was over 10 ksi (68.9 MPa).

Comparative Example 2: W Diffusion Bounded to Ti Backing Plate with Copper Layer A pure tungsten sputtering target (100 wt. % tungsten with inevitable impurities) was diffusion bonded to a pure titanium backing plate (100 wt. % titanium with inevitable impurities) using only a copper layer.

A copper layer was formed on the tungsten sputtering target. The copper layer was formed on the surface of the tungsten through electroplating. The copper layer has a thickness of 1-10 µm.

A sputtering target assembly was created by stacking the titanium backing plate and the tungsten sputtering target having the copper layer. This sputtering target assembly was bonded with HIP at 520° C. and 25 kilopounds per square inch (ksi) (172 MPa).

Three samples were prepared using the method of Comparative Example 2. In each of the three samples, the backing plate separated from the sputtering target during machining, which is not commercially acceptable. The bond strength and percent bonding could not be measured because of the samples debonded during machining.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above-described features.

What is claimed is:

1. A sputtering target assembly comprising:
a tungsten containing sputtering target, wherein the tungsten containing sputtering target comprises 0 wt. % to about 50 wt. % of an alloying component and the balance is tungsten, wherein the alloying component is selected from the group consisting of titanium, aluminum and molybdenum;
a titanium containing backing plate attached to the tungsten containing sputtering target; and
an interlayer positioned between and diffusion bonding the tungsten containing sputtering target and titanium containing backing plate, the interlayer comprising:
a nickel layer immediately adjacent to the tungsten containing sputtering target; and
a copper layer immediately adjacent to the nickel layer, wherein the nickel layer is from 1 micron to 10 microns thick, wherein the copper layer is oxygen-free copper and is about 0.254 mm to 7.62 mm thick, and wherein the sputtering target assembly has a bond strength of at least 10 ksi (68.9 MPa).

2. The sputtering target assembly of claim 1 wherein the alloying component is titanium and the tungsten containing sputtering target comprises titanium in an amount from about 1 wt. % to about 30 wt. % and the balance is tungsten.

3. The sputtering target assembly of claim 1 wherein the alloying component is titanium and the tungsten containing sputtering target comprises titanium in an amount from about 3 wt. % to about 15 wt. % and the balance is tungsten.

4. The sputtering target assembly of claim 1 wherein the tungsten containing sputtering target comprises 100 wt. % tungsten.

5. The sputtering target assembly of claim 1 wherein the alloying component is aluminum and the tungsten containing sputtering target comprises aluminum in an amount from about 0.1 wt. % to about 5 wt. % and the balance is tungsten.

6. The sputtering target assembly of claim 1 wherein the alloying component is molybdenum and the tungsten containing sputtering target comprises molybdenum in an amount from about 1 wt. % to about 50 wt. % and the balance is tungsten.

7. The sputtering target assembly of claim 1 wherein the tungsten containing sputtering target has a purity of at least 3N.

8. The sputtering target assembly of claim 1 wherein the titanium containing backing plate has a coefficient of thermal expansion (CTE) from about $8.6 \times 10^{-6}$ m/m° C. to about $10 \times 10^{-6}$ m/m° C.

9. The sputtering target assembly of claim 1 wherein the tungsten containing sputtering target has a coefficient of thermal expansion (CTE) from about $4.5 \times 10^{-6}$ m/m° C. to about $8 \times 10^{-6}$ m/m° C.

10. The sputtering target assembly of claim 1 wherein a percent bond formed by the interlayer is at least about 98% as determined with C-Scan.

11. The sputtering target assembly of claim 1 wherein the interlayer consists of the nickel layer and the copper layer.

12. The sputtering target assembly of claim 1 wherein the bond strength is at least 10 ksi (68.9 MPa) and not more than 30 ksi (207 MPa).

13. A method for forming a sputtering target assembly, the method comprising:
forming a nickel layer on a back surface of a tungsten containing target, the tungsten containing target comprising 0 wt. % to about 50 wt. % of an alloying component and the balance tungsten, the alloying component is selected from the group consisting of titanium, aluminum, and molybdenum;
forming a copper layer on the nickel layer from oxygen-free copper and hot pressing to bond, the copper layer immediately adjacent to the nickel layer, the copper layer having a thickness of about 0.254 mm to 7.62 mm; and
diffusion bonding the tungsten containing sputtering target to a titanium containing backing plate, wherein the nickel layer is from 1 micron to 10 microns thick and wherein the sputtering target assembly has a bond strength of at least 10 ksi (68.9 MPa).

14. The method of claim 13 wherein the alloying component is tungsten and the tungsten containing sputtering target comprises titanium in an amount from about 1 wt. % to about 30 wt. % and the balance is tungsten.

15. The method of claim 13 wherein the tungsten containing sputtering target comprises 100 wt. % tungsten and impurities.

16. The method of claim 13 wherein the alloying component is molybdenum and the tungsten containing sputtering target comprises molybdenum in an amount from about 1 wt. % to about 50 wt. % and the balance is tungsten.

17. The method of claim 13 wherein the sputtering target assembly has a percent bond of at least 98% and less than 100%.

18. The method of claim 13 wherein forming the nickel layer includes forming the nickel layer of less than about 10 microns by electroplating.

* * * * *